United States Patent
Peng et al.

(10) Patent No.: US 6,929,713 B2
(45) Date of Patent: Aug. 16, 2005

(54) IN-SITU PHOTORESIST REMOVAL BY AN ATTACHABLE CHAMBER WITH LIGHT SOURCE

(75) Inventors: Chiang Jen Peng, Hsin Chu (TW); Dian Hau Chen, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 309 days.

(21) Appl. No.: 10/186,533

(22) Filed: Jul. 1, 2002

(65) Prior Publication Data

US 2002/0164878 A1 Nov. 7, 2002

Related U.S. Application Data

(62) Division of application No. 09/256,270, filed on Feb. 23, 1999, now Pat. No. 6,429,142.

(51) Int. Cl.[7] .......................... C23F 1/00; H01L 21/306
(52) U.S. Cl. ............ 156/345.31; 438/689; 156/345.37; 134/1.2; 134/1.3; 134/84
(58) Field of Search .................... 438/689; 134/1.2–1.3, 134/84, 105; 156/345.31, 345.37, 345.27

(56) References Cited

U.S. PATENT DOCUMENTS

| | | | |
|---|---|---|---|
| 5,100,499 A | * 3/1992 | Douglas | 216/66 |
| 5,496,438 A | 3/1996 | Wootton et al. | 156/643.1 |
| 5,503,964 A | 4/1996 | Nishina et al. | 430/329 |
| 5,591,654 A | 1/1997 | Kishimura | 437/26 |
| 5,677,113 A | * 10/1997 | Suzuki et al. | 430/329 |
| 5,840,203 A | 11/1998 | Peng | 216/66 |
| 6,103,055 A | * 8/2000 | Maher et al. | 156/345.32 |
| 6,325,861 B1 | * 12/2001 | Stinnett | 134/2 |

* cited by examiner

Primary Examiner—Douglas Wille
Assistant Examiner—Ginette Peralta

(57) ABSTRACT

A method of fabricating integrated circuit wafers, in accordance with this invention comprises the following steps. Provide an integrated circuit wafer having devices formed therein covered with a metal layer and a photoresist layer over the metal layer which is selectively exposed and developed forming a photoresist mask. Introduce the wafer into a multi-chamber system, patterning the metal layer by etching and then exposing the mask to light in a cooled chamber wherein the light is derived from a source selected from a mercury lamp and a laser filtered to remove red and infrared light therefrom before exposure of the wafer thereto. The chamber is cooled by a refrigerant selected from water and liquefied gas Then remove the wafer, and load it into a photoresist stripping tank to remove the photoresist mask with a wet photoresist stripper. Place the wafer in a batch type plasma chamber after removing the photoresist mask. Establish a plasma discharge in the batch type plasma chamber for a first time while flowing oxygen gas through the batch type plasma chamber. Terminate the plasma discharge, and then remove the wafer from the batch type plasma chamber.

7 Claims, 4 Drawing Sheets

IN-SITU PHOTORESIST REMOVAL BY AN ATTACHABLE CHAMBER WITH LIGHT SOURCE

This is a division of patent application Ser. No. 09/256,270, filing date Feb. 23, 1999 now U.S. Pat. No. 6,429,142, In-Situ Photoresist Removal By An Attachable Chamber With Light Source, assigned to the same assignee as the present invention.

BACKGROUND OF THE INVENTION

1. Field of the Invention

This invention relates to methods of fabrication of microelectronic devices, and more particularly to methods for facilitating removal and stripping of photoresist layers employed in fabrication of microelectronics devices.

2. Description of Related Art

Microelectronics devices are formed from microelectronics substrates over which are formed patterned microelectronics conductor layers which are separated by microelectronics dielectric layers.

In the process of forming microelectronics devices and patterned microelectronics layers, such as but not limited to patterned microelectronics conductor layers, within microelectronics fabrications, it is common to employ patterned photoresist layers as mask layers for forming those microelectronics devices and patterned layers from previously deposited blanket layers.

While the use of patterned photoresist layers as mask layers when forming microelectronics devices and patterned layers from corresponding blanket layers within microelectronics devices is thus quite common in the art of microelectronics fabrication, the use of patterned photoresist layers as mask layers in a process of forming microelectronics devices and patterned layers from blanket layers within microelectronics devices is not without problems. Specifically, it is common in microelectronics fabrication for patterned photoresist layers which have been employed as mask layers for forming devices and patterned layers often to be particularly difficult to strip patterned photoresist from a microelectronics device or patterned microelectronics layer whose fabrication is facilitated employing the patterned photoresist layer. Typical microelectronics fabrication processes which provide patterned photoresist layers which are difficult to strip include but are not listed to reactive ion etch (RIE) plasma etch processes and ion implantation processes.

It is thus towards the goal of providing, within the art of microelectronics fabrication methods which facilitate stripping of patterned photoresist layers, and particularly methods which facilitate stripping of patterned photoresist layers which have been employed as mask layers for forming microelectronics devices and patterned microelectronics layers from corresponding blanket microelectronics layers within microelectronics devices, that the present invention is directed.

Various methods have been disclosed in the art of microelectronics fabrication for forming and stripping patterned photoresist layers which may be employed as mask layers for fabricating microelectronics devices and patterned microelectronics layers within microelectronics devices.

Commonly assigned, U.S. Pat. No. 5,840,203 of Chiang Jen peng for "In-Situ Bake Step in Plasma Ash Process to Prevent Corrosion" describes a modified dry etching or plasma ashing, method for removing photoresist residue which avoids corrosion of metal electrodes. Wafers are placed in a batch type plasma chamber wherein oxygen gas flows and an RF plasma is established to remove the residue. After the RF power is removed, the wafers, still in the batch type plasma chamber, are baked either with no oxygen flow or with a low oxygen flow rate. The baking drives off chlorine and other ions which can cause metal corrosion. The wafers are then removed from the batch type plasma chamber and normal processing continues.

Wooton et al. U.S. Pat. No. 5,496,438 for a "Method of Removing Photo Resist" describes a method for stripping patterned photoresist layer contaminated with absorbed corrosive, etchant chlorine gas from a chlorine gas plasma used to etch a metal layer protected by the photoresist. The problem is to removed the contaminated photoresist from the patterned metal layer without staining the patterned metal layer. The patterned photoresist layer is stripped by an ashing process within an oxygen gas plasma for a period of time and at a sufficiently high temperature such that substantially all of the residual corrosive gas absorbed within the patterned photoresist layer is removed, but the temperature employed is below a temperature at which the patterned metal layer begins to flow. The ashing process is performed at a temperature from at least 270° C. or preferably from at least 300° C. for a minimum time of two or three minutes.

Nishina et al., in U.S. Pat. No. 5,503,964, for a "Resist Removing Method" describes a method in which an ultraviolet radiation hardening treatment is applied to a patterned photoresist (novolak) layer prior to employing the ultraviolet radiation hardened patterned photoresist layer as a mask for an ion implantation step of implanting ions into a silicon substrate. After the ion implantation step, the mask layer is exposed to an ashing step in which an oxygen containing plasma is excited by microwaves at a temperature of 100° C. to 200° C. and a pressure under 2 Torr to 5 Torr to strip away the photoresist layer by decomposing it into carbon dioxide. The initial ultraviolet radiation hardening step reduces the problems of removing photoresist damaged by the ion implantation step and makes it possible to avoid the use of hydrogen gas and high frequency fields during the ashing operation.

Kishimura U.S. Pat. No. 5,591,654, for a "Method of Manufacturing a Semiconductor Device an a Resist Composition Used Therein" describes depositing and prebaking a blanket photoresist layer formed on a substrate at 80° C. for 90 sec. The prebaked photoresist layer is exposed to a pattern from a reticle in a stepper after which the exposed photoresist is subjected to thermal baking at 120° C. for 90 sec. Next, exposed and post baked photoresist layer is developed, rinsed and baked once again at 110° C. for 120 sec. to form a mask. The substrate is subjected to ion implantation through the thrice baked mask. Then the work is subjected to a fourth baking step followed by removal of the remaining photoresist by ashing in an oxygen plasma.

SUMMARY OF THE INVENTION

An object of this invention is easy handling of photoresist removal on a continuous flow basis.

Another object of this invention is to avoid impacting WIP and throughput of the etcher.

Another object of this invention is to minimize the number of process steps and to reduce manufacturing handling.

A method of fabricating integrated circuit wafers, in accordance with this invention comprises the following steps. Provide an integrated circuit wafer having devices formed therein. Form a metal layer over the integrated circuit wafer. Form a photoresist layer over the metal layer. Selectively expose the photoresist layer. Develop the selectively exposed photoresist layer thereby forming a photoresist mask.

Perform the multi-chamber steps as follows:
a) introduce the wafer into a multi-chamber system,
b) etch away that part of the metal layer not covered by the photoresist mask,
c) expose the mask to light in a cooled chamber wherein
   1) the light is derived from a source selected from a mercury lamp and a laser,
   2) the light passes through a filter system which removes red and infrared light therefrom before exposure of the wafer thereto,
   3) the cooled chamber is cooled by a refrigerant selected from water and liquefied gas circulated through cooling coils by a pump, and
d) remove the wafer from the multi-chamber system, and Load the wafer into a photoresist stripping tank thereby removing the photoresist mask using a wet photoresist stripper. Place the wafer in a batch type plasma chamber after removing the photoresist mask. Establish a plasma discharge in the batch type plasma chamber for a first time while flowing oxygen gas through the batch type plasma chamber. Terminate the plasma discharge, and then remove the wafer from the batch type plasma chamber.

The plasma discharge is produced by a radio frequency power source.

The metal layer is composed of a material selected from the group consisting of aluminum, aluminum/copper, and aluminum/copper/silicon.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Approaches considered by the applicants for photoresist removal flow of passivation, via, align mark are as follows:
(1) Photoresist→Etch chamber→photoresist stripper tank (a,b,c)→Mattson or
(2) photoresist→Etch chamber→post-etch light treatment (d)→photoresist stripper tank→Mattson.

The disadvantages of the above flow sequences are as follows:
(a) photoresist strip ability is low for large-area photoresist film at photoresist stripper step.
(b) Large-area film photoresist will redeposit back to wafer and cause photoresist remain.
(c) Prolonging process time and increasing the process temperature of the wet etch steps reduces throughput and increases fabrication safety concerns.
(d) Multi-step processes for etching and light treatment will cause delays which impact WIP seriously.

Referring to to FIGS. 1A–1E, a cross-sectional, elevational view of a workpiece 8 is shown in the process of manufacture using a batch type plasma etching method of patterning the workpiece in accordance with the method of this invention.

Figure 4:
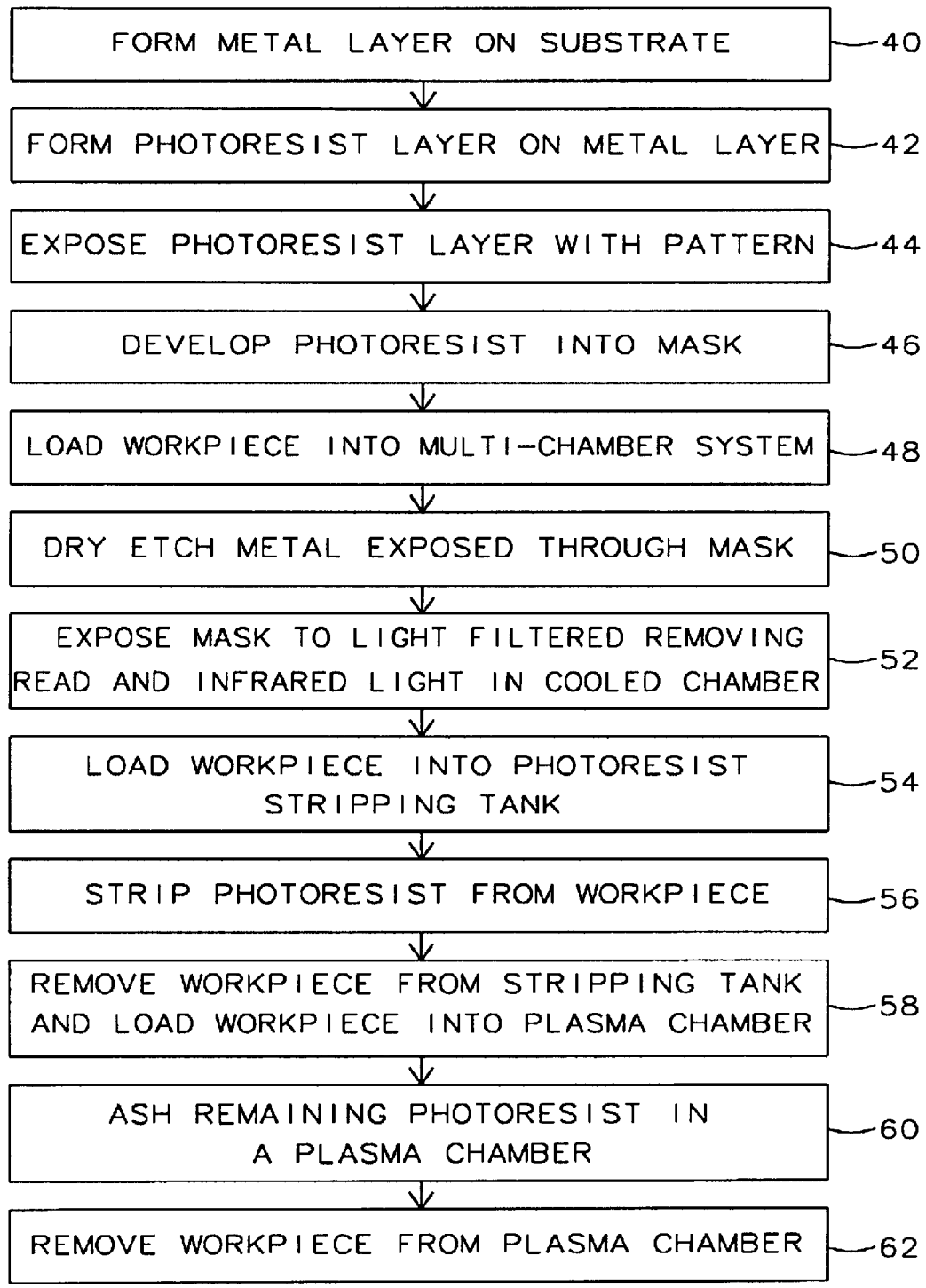
FIG. 4 shows a flow chart of one embodiment of the batch type plasma ash method of this invention used to remove photoresist residue and avoid metal corrosion.

FIG. 4 shows a flow chart of one embodiment of the batch type plasma ash method of this invention used to remove photoresist residue and avoid metal corrosion.

Figure 1A:
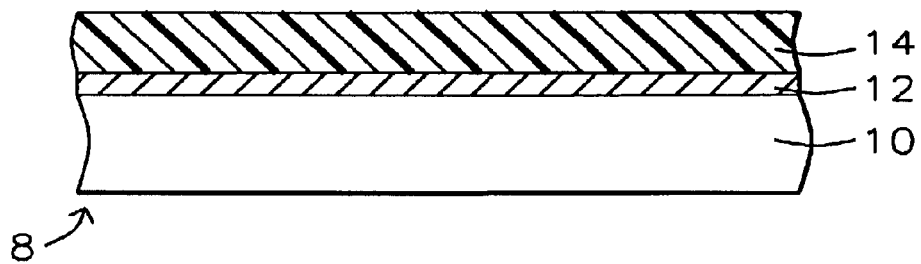
FIGS. 1A–1E shows a cross-sectional, elevational view of a workpiece in the process of manufacture using a batch type plasma etching method of patterning the workpiece in accordance with this invention.

FIG. 1A shows workpiece 8 which includes an integrated circuit wafer 10. Step 40 in FIG. 4 begins the method of this invention as a with a blanket metal layer 12, e.g. aluminum, aluminum/copper, or aluminum/copper/silicon, being formed on the wafer 10. In addition, a dielectric layer, not shown, may be located between wafer 10 and the metal layer 12. Devices, such as FET transistors, may be formed in and/or on wafer 10 at this stage or later, as will be well understood by those skilled in the art.

Then in accordance with step 42 in FIG. 4 a blanket photoresist layer 14 is formed on the metal layer 12.

Figure 1B:
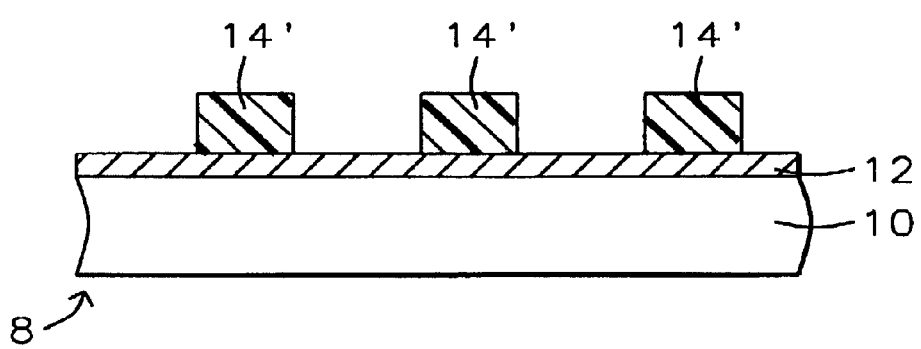

FIG. 1B shows the workpiece 8 of FIG. 1A after the photoresist layer 14 has been selectively exposed with a pattern by exposure of the layer 14 to a pattern of radiation for patterning through a reticle, in accordance with step 44 in FIG. 4, as is well understood by those skilled in the art of photolithography. Photoresist layer 14 was then developed in accordance with step 46 in FIG. 4 to form a photoresist mask 14' with openings therethrough down to the metal layer 12 which exposes the upper surface of metal layer 12 for further processing in step 50, as described below.

Figure 1C:
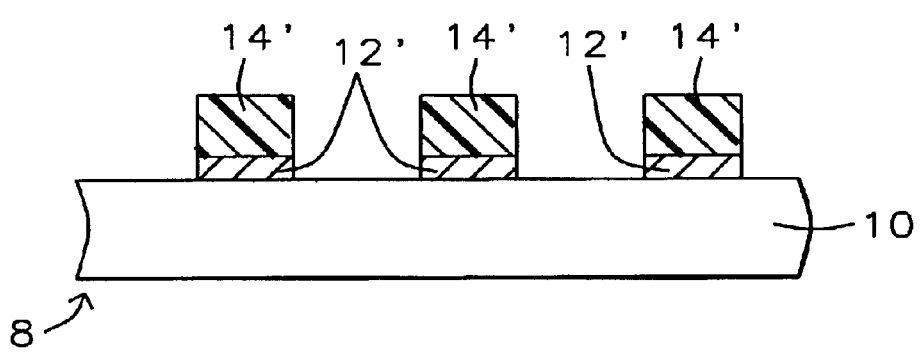
Figure 2:
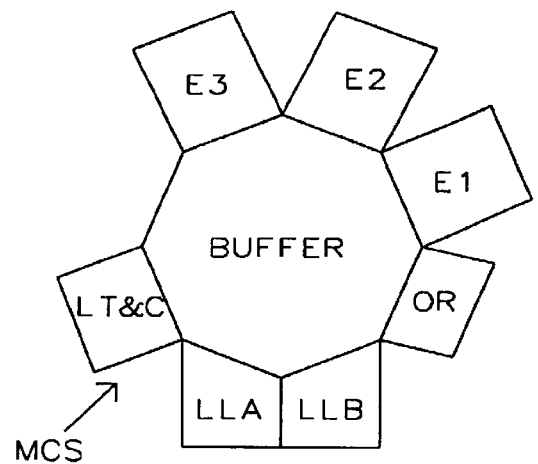
FIG. 2 shows a diagram of a batch type wafer Multi-Chamber System used for processing workpieces such as those shown in FIGS. 1A–1E, in accordance with this invention.

FIG. 1C shows the workpiece 8 of FIG. 1B after the workpiece 8 has been introduced in step 48 into a Multi-Chamber System MCS shown in FIG. 2 through an work input load lock LLA and through an orienter OR into an etching chamber E1.

The workpiece 8 moves through chambers E1, E2 and E3 in the MCS chamber, wherein portions of the metal layer 12 not covered by the photoresist mask 14' are removed by dry etching, in accordance with step 50 in FIG. 4, using a method such as reactive ion etching, thereby replicating the pattern in the mask 14' by etching that pattern through the metal electrodes 12'. In the past, the metal etching step has frequently used chlorine based etching and adsorbed and implanted chlorine ions have been left behind in and/or on the sidewalls of the metal electrodes 12'. The chlorine ions would cause metal corrosion if they were not removed in a timely fashion.

Figure 1D:
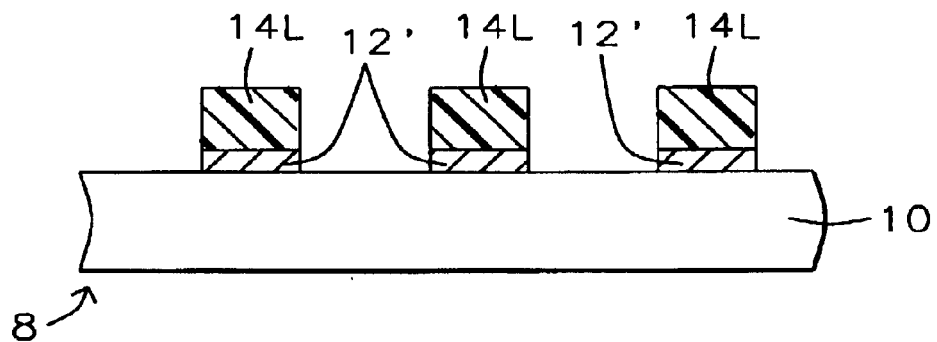
Figure 3:
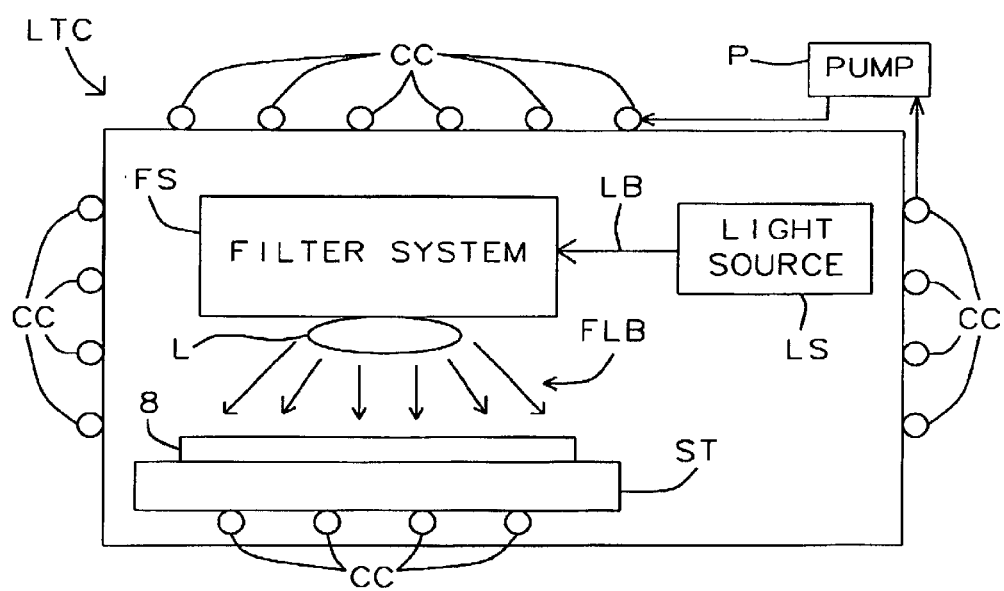
FIG. 3 shows the workpiece of FIG. 1C located in a combined light treatment and cooling chamber in the multi-chamber system of FIG. 2, in accordance with this invention.

FIG. 1D shows the workpiece 8 of FIG. 1C after the workpiece 8 has completed the etching process and workpiece 8 has been moved, in step 52 in FIG. 4, to a combined light treatment and cooling chamber LT&C in the multi-chamber system MCS and the photoresist mask 14' of FIG. 1C has been exposed to treatment with a light source LS in situ, as shown in FIG. 3, filtered by a filter system FS free from light in the relatively long wavelength ranges from infra red to red. Light from filter system FS passes through a lens L onto the workpiece 8. The exposure to the light from lens L converts the mask 14' into photoexposed mask 14L. The filter FS exposes the workpiece 8 to the shorter wavelength light to prevent polymerization of mask 14' as it is converted into mask 14L. The cooling is employed to remove the heat from the light passing through lens L to avoid hard baking of the photoresist mask 14' during conversion thereof into photoexposed photoresist mask 14L on the workpiece 8.

Figure 1E:
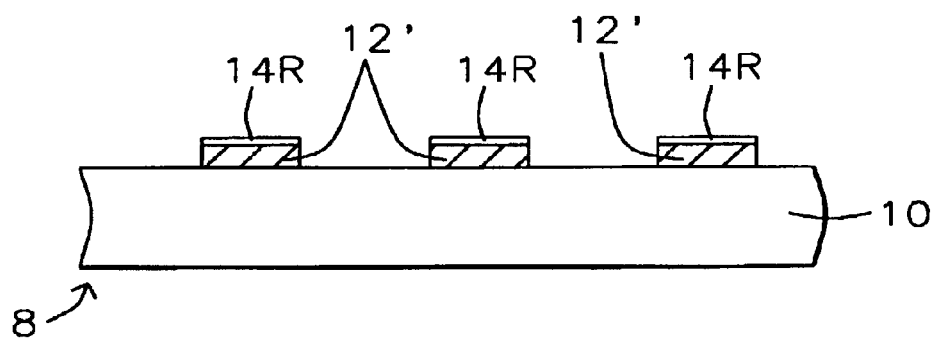

FIG. 1E shows the workpiece 8 of FIG. 1D after the workpiece 8 was removed from the multi-chamber system MCS, in accordance with step 54 in FIG. 4, and was loaded into a conventional PRS (PhotoResist Stripping) tank (not shown) to strip away the photoexposed photoresist mask 14L. Mask 14L has been removed using a wet photoresist stripper in the PRS tank. The wet photoresist stripper removes most of the photoresist of mask 14L, however a photoresist residue 14R remains on the surface of the metal electrodes 12' and photoresist residue 14R must be removed.

Figure 1F:
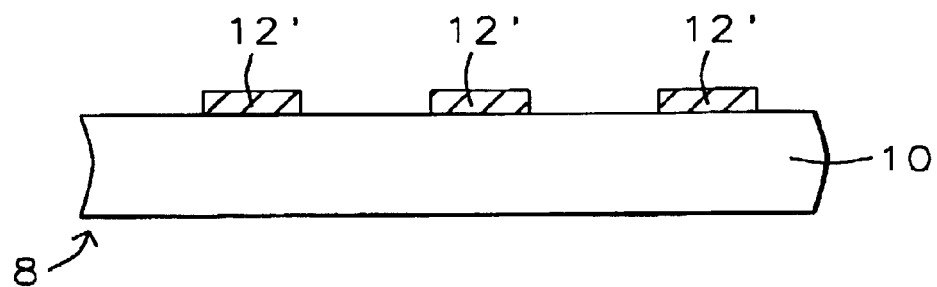

FIG. 1F shows the workpiece 8 of FIG. 1E after the workpiece 8 was placed in a plasma chamber for ashing as described in flow diagram step 58, after the photoresist has been mostly removed using a wet photoresist stripper. Step 58 comprises a batch type dry etching method, commonly referred to as plasma ashing (in a Mattson Technoloy, Inc. type chamber), which has been used to remove the photoresist residue 14R leaving the surface of metal electrodes 12' completely exposed. A source of oxygen gas provides means to flow oxygen gas through a plasma chamber as shown in U.S. Pat. No. 5,840,203 of Peng described above. A source of radio frequency power provides means to establish and maintain a radio frequency plasma discharge. The radio frequency power of between about 300 and 800 watts is supplied to the chamber for between about 15 and 100 minutes as oxygen gas is flowed through the chamber at a flow rate of between about 300 and 800 sccm, thereby establishing a radio frequency plasma discharge. This radio frequency plasma discharge removes any remaining photoresist residue.

Finally, at the end of step 60, the workpiece 8 is removed from the ashing plasma chamber as indicated in step 62 in FIG. 4.

An advantage of the process of this invention is that it provides a modification to the batch type dry etching to remove the chlorine and ions, such as $AlCl_3$, left behind from the metal etching step and avoids metal corrosion.

FIG. 2 shows a diagram of a batch type wafer Multi-Chamber System MCS used for processing the workpieces such as workpiece 8 from step 48 to step 52 in FIG. 4. Workpieces 8 are loaded into the system MCS through an input load lock LLA. Orienter O orients workpieces 8 which can pass through one or more of the etching chambers E1, E2 and/or E3 via the buffer region. In step 48, the etching chambers E1, E2 and/or E3 portions of a workpiece 8, not covered by the photoresist mask 14' are etched away, using a method such as reactive ion etching thereby forming a pattern as provided by the photoresist mask 14'. Then the workpiece 8 can be passed through the in situ light treatment and cooling chamber LT&C of FIG. 2 to prepare the photoresist mask 14' for stripping in accordance with this invention without polymerization or hard baking. Workpieces 8 are unloaded, after step 52, from the system MCS through an output load lock LLB which adjoins the buffer of the Multi-Chamber System MCS.

FIG. 3 shows the workpiece 8 of FIG. 1C after the workpiece 8 has been moved to a combined light treatment and cooling chamber LTC in the multi-chamber system MCS. The workpiece 8 rests on a stage ST which is cooled by cooling coils CC with a refrigerant comprising water and/or liquefied gas which is circulated by a pump P. The light treatment and cooling chamber LTC also has cooling coils CC on the walls thereof to remove heat from the chamber LTC through which coolant is circulated by pump p or a separate circulation apparatus. Within the chamber LTC, the photoresist mask 14' of FIG. 1D has been exposed to treatment with a light source LS, as shown in FIG. 3. The light from light source LS is filtered by an optical filter system FS to produce a light beam FLB free from light in the relatively long wavelength ranges from infra-red to red. Light from filter system FS passes through a lens L to flood the workpiece 8 with the filtered light to convert the photoresist mask 14' into the photoexposed photoresist mask 14L.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. Apparatus for fabricating integrated circuit wafers, comprising a multi-chamber system as follows:

input load lock means for introducing a wafer into an etching chamber in said multi-chamber system, said etching chamber being adapted for etching away a metal layer not covered by a photoresist mask, means for loading said wafer from said etching chamber into a cooled chamber for exposing said mask to light other than red light or infra-red light, means for loading said wafer from said cooled chamber into a stripping tank for stripping the photoresist mask, means for loading said wafer from said stripping tank into an ashing chamber for performing ashing therein, and output load lock means for removing said wafer from said multi-chamber system.

2. The apparatus of claim 1 wherein said light is derived from a source selected from a mercury lamp and a laser.

3. The apparatus of claim 1 wherein said light passes through a filter system which removes red and infrared light therefrom before exposure of said wafer thereto.

4. The apparatus of claim 1 wherein:

said light is derived from a source selected from a mercury lamp and a laser, and said light passes through a filter system which removes red and infrared light therefrom before exposure of said wafer thereto.

5. The apparatus of claim 1 wherein said cooled chamber is cooled by a refrigerant selected from water and liquefied gas circulated through cooling coils by a pump.

6. The apparatus of claim 1 wherein:

said cooled chamber is cooled by a refrigerant selected from water and liquefied gas circulated through cooling coils by a pump, and said light is derived from a source selected from a mercury lamp and a laser.

7. The apparatus of claim 1 wherein:

said cooled chamber is cooled by a refrigerant selected from water and liquefied gas circulated through cooling coils by a pump, and said light passes through a filter system which removes red and infrared light therefrom before exposure of said wafer thereto.

* * * * *